United States Patent
Kim et al.

(10) Patent No.: US 9,805,302 B2
(45) Date of Patent: Oct. 31, 2017

(54) SYNAPSE CIRCUIT AND NEUROMORPHIC SYSTEM INCLUDING THE SAME

(71) Applicants: SAMSUNG ELECTRONICS CO., LTD., Suwon-si (KR); POSTECH ACADEMY-INDUSTRY FOUNDATION, Pohang-si (KR)

(72) Inventors: Jun Seok Kim, Hwaseong-si (KR); Jae Yoon Sim, Pohang-si (KR); Hyun Surk Ryu, Hwaseong-si (KR)

(73) Assignees: Samsung Electronics Co., Ltd., Suwon-si (KR); Postech Academy-Industry Foundation, Pohang-si (KR)

( * ) Notice: Subject to any disclaimer, the term of this patent is extended or adjusted under 35 U.S.C. 154(b) by 507 days.

(21) Appl. No.: 14/213,368

(22) Filed: Mar. 14, 2014

(65) Prior Publication Data
US 2014/0358834 A1 Dec. 4, 2014

(30) Foreign Application Priority Data

May 30, 2013 (KR) .................. 10-2013-0061924

(51) Int. Cl.
| G06N 3/063 | (2006.01) |
| G06N 3/04 | (2006.01) |
| G11C 11/54 | (2006.01) |
| G11C 13/00 | (2006.01) |

(52) U.S. Cl.
CPC ........... *G06N 3/049* (2013.01); *G06N 3/0635* (2013.01); *G11C 11/54* (2013.01); *G11C 13/0007* (2013.01)

(58) Field of Classification Search
None
See application file for complete search history.

(56) References Cited

U.S. PATENT DOCUMENTS

| 2005/0174854 A1* | 8/2005 | Tsushima ............ H01L 27/2436 365/185.29 |
| 2009/0292661 A1* | 11/2009 | Haas .................... G06N 3/0635 706/33 |
| 2011/0119214 A1* | 5/2011 | Breitwisch ........... G06N 3/0635 706/33 |

(Continued)

FOREIGN PATENT DOCUMENTS

| JP | 2010-14651 A | 7/2010 |
| WO | WO 2010/133399 A1 | 11/2010 |
| WO | WO 2012/006469 A1 | 1/2012 |

OTHER PUBLICATIONS

Afifi, et al. STDP implementation using memristive nanodevice in CMOS-Nano neuromorphic networks. IEICE Electronics Express vol. 6 No. 3 (2009). pp. 148-153.*

(Continued)

*Primary Examiner* — Kakali Chaki
*Assistant Examiner* — Eric Nilsson
(74) *Attorney, Agent, or Firm* — NSIP Law (57) ABSTRACT

A synapse circuit to perform spike timing dependent plasticity (STDP) operation is provided. The synapse circuit includes a memristor having a resistance value, a transistor connected to the memristor, and the transistor configured to receive at least two input signals. The resistance value of the memristor is changed based on a time difference between the at least two input signals received by the transistor.

19 Claims, 6 Drawing Sheets

(56) References Cited

U.S. PATENT DOCUMENTS

2011/0153533 A1    6/2011   Jackson et al.
2012/0011090 A1    1/2012   Tang et al.
2012/0084241 A1    4/2012   Friedman et al.

OTHER PUBLICATIONS

Indiveri, et al. Neuromorphic silicon neuron circuits. Frontiers in Neuroscience. vol. 5 article 73. (2011). pp. 1-23.*

Vogelstein, R., et al. "Dynamically reconfigurable silicon array of spiking neurons with conductance-based synapses." IEEE transactions on neural networks 18.1 (2007): 253-265.*

Xia, Qiangfei, et al. "Memristor—CMOS hybrid integrated circuits for reconfigurable logic." Nano letters 9.10 (2009): 3640-3645.

Jo, Sung Hyun, et al. "Nanoscale memristor device as synapse in neuromorphic systems." Nano letters 10.4 (2010): 1297-1301.

Kim, Seungjun, et al. "Flexible memristive memory array on plastic substrates." Nano letters 11.12 (2011): 5438-5442.

Mishra, Nilesh, et al. "4-Transistors of Dynamic Memristor based TCAM." IJERA 2.3 (2012): 2520-2524.

Fei, Wei, et al. "Design exploration of hybrid CMOS and memristor circuit by new modified nodal analysis." IEEE (15 pages, in English).

M.A. Zidan, et al. "Memristor-based memory: The sneak paths problem and solutions." Microelectron. J (2012): (8 pages, in English).

\* cited by examiner

SYNAPSE CIRCUIT AND NEUROMORPHIC SYSTEM INCLUDING THE SAME

CROSS-REFERENCE TO RELATED APPLICATION(S)

This application claims the benefit under 35 USC 119(a) of Korean Patent Application No. 10-2013-0061924 filed on May 30, 2013, in the Korean Intellectual Property Office, the entire disclosure of which is incorporated herein by reference for all purposes.

BACKGROUND

1. Field

The following description relates to a synapse circuit for operation of spike-timing dependent plasticity (STDP) and a neuromorphic system that includes such a synapse circuit.

2. Description of Related Art

A brain includes hundreds of billions of neurons that are interconnected with one another in a complicated nerve network. Neurons are responsible for the intellectual capability for learning and memory. Neurons use their synapses to exchange signals with thousands of other neurons. Thus, the neurons are the structural and functional base units for data transmission. A synapse refers to a junction between two neurons at which an axon of a first neuron and a dendrite of a second neuron are positioned next to each other for exchange of signals. A single neuron is generally connected with thousands of other neurons via synapses.

A neuromorphic chip refers to a semiconductor circuit that is designed to mimic the operation of biological nervous system. A neuromorphic chip may be used to implement an intelligent system that is capable of adapting itself to an unspecified environment. However, in implementing such a system, it is difficult to integrate a large scale of artificial neurons in a small area by a general semiconductor manufacturing technology.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a synapse circuit to perform spike timing dependent plasticity (STDP) operation, the synapse circuit including a memristor having a resistance value, and a transistor connected to the memristor, the transistor configured to receive at least two input signals, in which the resistance value of the memristor is changed based on a time difference between the at least two input signals received by the transistor.

The resistance value of the memristor may be changed based on a voltage change caused by the time difference between the at least two input signals.

The resistance value of the memristor may be changed based on a time difference between a first input signal applied to a gate terminal of the transistor and a second input signal based on a membrane voltage applied to a source terminal of the transistor.

A direction of a current flowing on the memristor may be determined by a voltage difference caused by the time difference between the first input signal and the second input signal.

An amount of a current flowing on the memristor may be determined by a voltage difference caused by the time difference between the first input signal and the second input signal.

The synapse circuit may further include a first terminal connected to the gate terminal of the transistor and configured to provide the first input signal, and a second terminal connected to the source terminal of the transistor and configured to provide the second input signal, and the synapse circuit may be connected to a pre-synaptic neuron circuit through the first terminal and to a post-synaptic neuron circuit through the second terminal.

The post-synaptic neuron circuit is configured to generate a spike fired with reference to a resting voltage.

The post-synaptic neuron circuit may include an N-metal oxide semiconductor (MOS) and a P-MOS transistor, the N-MOS transistor and the P-MOS transistor being serially connected, a resting voltage source to supply the resting voltage may be connected to a source terminal of the N-MOS transistor, and a capacitor may be connected to a source terminal of the P-MOS transistor.

Different voltages may be applied to the memristor and the source terminal of the transistor.

The memristor may be connected to a drain terminal of the transistor.

A channel of the memristor may be serially connected to a channel of the transistor.

The transistor may include an N-MOS transistor.

In another general aspect, there is provided a neuromorphic system including: a synapse circuit configured to perform spike timing dependent plasticity (STDP) operation, the synapse circuit including a first terminal, a second terminal, a memristor having a resistance value, and a transistor connected to the memristor; a pre-synaptic neuron circuit connected to the memristor through the first terminal of the synapse circuit; and a post-synaptic neuron circuit connected to the memristor through the second terminal of the synapse circuit. The resistance value of the memristor may be changed based on a time difference between at least two input signals received by the synapse circuit.

The first terminal of the synapse circuit may be connected to a gate terminal of the transistor to provide a first input signal. The second terminal of the synapse circuit may be connected to a source terminal of the transistor to provide a second input signal.

The resistance value of the memristor may be changed based on a time difference between the first input signal applied to the gate terminal of the transistor and the second input signal based on a membrane voltage applied to the source terminal of the transistor.

A direction of a current flowing on the memristor may be determined by a voltage difference caused by the time difference between the first input signal and the second input signal.

An amount of a current flowing on the memristor may be determined by a voltage difference caused by the time difference between the first input signal and the second input signal.

The post-synaptic neuron circuit may be configured to generate a spike fired with reference to a resting voltage.

The post-synaptic neuron circuit may include an N-metal oxide semiconductor (MOS) and a P-MOS transistor, in which the N-MOS transistor and the P-MOS transistor are serially connected. A resting voltage source to supply the resting voltage may be connected to a source terminal of the N-MOS transistor. A capacitor may be connected to a source terminal of the P-MOS transistor.

In another general aspect, there is provided a method of performing spike timing dependent plasticity (STDP) operation between a pre-synaptic neuron circuit and a post-synaptic neuron circuit, the method involving: receiving a pre-synaptic input signal from the pre-synaptic neuron circuit; receiving a post-synaptic input signal from the post-syantic neuron circuit; and adjusting a resistance value of a memristor based on a time difference between the pre-synaptic input signal and the post-synaptic input signal.

Other features and aspects will be apparent from the following detailed description, the drawings, and the claims.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Figure 1:
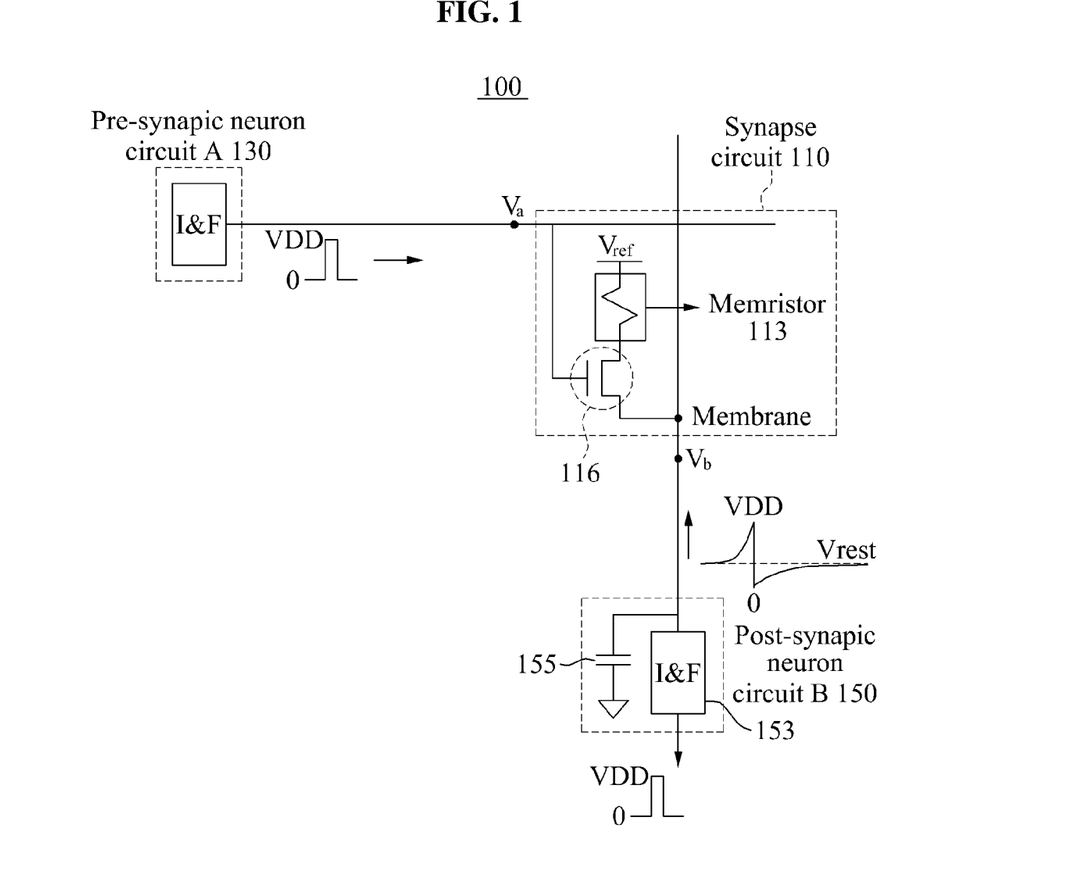
FIG. 1 is a diagram illustrating an example of a neuromorphic system that includes a synapse circuit for operation of spike-timing dependent plasticity (STDP).

FIG. 1 illustrates an example of a neuromorphic system 100 including a synapse circuit 110 for operation of spike-timing dependent plasticity (STDP).

STDP is a learning mechanism postulated to exist in synapses of nerve networks. Based on STDP, synaptic efficacy or weight is slightly altered between two neurons based on the timing of a pre-synaptic spike in a pre-synaptic neuron and a post-synaptic spike in a post-synaptic neuron.

Referring to FIG. 1, the neuromorphic system 100 includes the synapse circuit 110 as a base cell unit for performing an STDP function, a pre-synaptic neuron circuit A 130 connected to a front of the synapse circuit 110, and a post-synaptic neuron circuit B 150 connected to a back of the synapse circuit 110.

In this example, the synapse circuit 110 includes a memristor 113. A resistance value of the memristor 113 may be changed. The synapse circuit 110 also includes a transistor 116 that is connected to the memristor 113. The transistor 116 receives at least two input signals. The resistance value of the memristor 113 may be changed based on a difference in input time of the at least two input signals that are applied to the transistor 116.

For example, the resistance value of the memristor 113 may be changed according to a voltage change due to the input time difference of the input signals. For example, the resistance value of the memristor 113 may be changed according to a voltage change due to an input time difference between a first input signal and a second input signal. The first input signal may be a signal applied to a gate terminal of the transistor 116. The second input signal may be a signal based on a membrane voltage applied to a source terminal of the transistor 116. The first input signal may be transmitted from the pre-synaptic neuron circuit A 130, and the second input signal may be transmitted from the post-synaptic neuron circuit B 150.

A direction of the current flowing on the memristor 113 may be determined based on a difference in voltage caused by the input time difference between the first input signal and the second input signal. For example, in response to the first input signal being input to the transistor 116 earlier than the second input signal, the current may flow in a direction from the transistor 116 to the memristor 113. When the input signal is input to the transistor 116 later than the second input signal, conversely, the current may flow in a direction from memristor 113 to the transistor 116.

The direction and amount of the current flowing on the memristor 113 may be determined based on the voltage difference caused by the input time difference between the first input signal and the second input signal. For example, in response to the time difference between the first input signal and the second signal being sufficiently large such that the first input signal and the second input signal hardly influence each other, the transistor 116 is in an ON state during input of the first input signal and $V_{ref} > V_{rest}$ is satisfied. Therefore, the current flows in the direction from the memristor 113 to the transistor 116. In this case, since a voltage difference $V_{ref} - V_{rest}$ between opposite ends of the memristor 113 is smaller than a threshold voltage for changing characteristics of the memristor 113, the memristor 113 may stay in a high resistance state (HRS) and only a minor current of approximate zero flows on the memristor 113.

In the event that the input time difference between the first input signal and the second input signal is relatively small such that the input signals may influence each other, and in the event that the first input signal is input a bit earlier than the second input signal, the transistor 116 may be in the ON state during input of the first input signal, and a voltage $V_b$ of a source of the transistor 116 satisfies $V_b > V_{ref}$. Therefore, the current flows in the direction from the transistor 116 to the memristor 113. Here, in the event that the voltage difference $V_b - V_{ref}$ between the opposite ends of the memristor 113 is larger than the threshold voltage for changing characteristics of the memristor 113, the memristor 113 may stay in a low resistance state (LRS). When the memristor 113 is in the LRS, a relatively large amount of current may flow on the memristor 113. Otherwise, the memristor 113 may still stay in the HRS.

In the event that the input time difference between the first input signal and the second input signal is relatively small such that the input signals may influence each other, and in the event that the first input signal is input similar to or a bit later than the second input signal, the transistor 116 may be in the ON state during input of the first signal, and the voltage $V_b$ of the source of the transistor 116 satisfies $V_b < V_{ref}$. The current may flow in the direction from the memristor 113 to the transistor 116. In the event that the voltage difference $V_{ref} - V_b$ between the opposite ends of the memristor 113 is larger than the threshold voltage for changing characteristics of the memristor 113, the memristor 113 may stay in the HRS again. In this case, a relatively small amount of current flows in the memristor 113. Otherwise, the memristor 113 may still stay in the LRS.

In the event that the first input signal is provided much later than the second input signal, the input time difference is increased. Therefore, the input signal may not influence each other. In addition, since $V_{ref} > V_{rest}$ is satisfied, the current may flow in the direction from the memristor 113 to the transistor 116. Because the voltage difference $V_{ref} - V_{rest}$ between the opposite ends of the memristor 113 is smaller than the threshold voltage for changing characteristics of the memristor 113, the memristor 113 may stay in the HRS.

When $T(V_a)$ denotes an input time of the first input signal and $T(V_b)$ denotes an input time of the second input signal with respect to the transistor 116, a change in the resistance value of the memristor 113 according to the input time difference between the first input signal and the second input signal may be expressed by Table 1.

TABLE 1

| $T(V_a) - T(V_b)$ | Resistance state of memristor |
|---|---|
| ++~0 | HRS (High Resistance State) |
| 0~-- | LRS (Low Resistance State) |
| -- | HRS (High Resistance State) |

The direction and amount of current at the synapse circuit 110 is described hereinafter with reference to FIG. 3.

One end of the memristor 113 may be connected to a drain terminal of the transistor 116 while the other end is connected to a voltage source to apply a reference voltage.

A channel of the memristor 113 may be serially connected to a channel of the transistor 116.

Different voltages may be applied to the memristor 113 and the source terminal of the transistor 116. The transistor 116 connected to the memristor 113 may be an N-metal oxide semiconductor (MOS) transistor.

The synapse circuit 110 may further include a first terminal connected to the gate terminal of the transistor 116 to provide the first input signal, and a second terminal connected to the source terminal of the transistor 116 to provide the second input signal. The synapse circuit 110 may be connected to the pre-synaptic neuron circuit A 130 through the first terminal, and may be connected to the post-synaptic neuron circuit B 150 through the second terminal. A first voltage $V_a$ may be supplied from the pre-synaptic neuron circuit A 130 through the first terminal A second voltage $V_b$ may be supplied from the post-synaptic neuron circuit B 150 through the second terminal.

For example, the pre-synaptic neuron circuit A 130 and the post-synaptic neuron circuit B 150 may each include an integrate-and-fire (I&F) neuron for firing a spike or a pulse. The pre-synaptic neuron circuit A 130 and the post-synaptic neuron circuit B 150 may fire the spike or the pulse in response to an amount of a current received through the synapse circuit 110 exceeding a predetermined threshold.

The pulse from the pre-synaptic neuron circuit A 130 may be connected to the gate terminal of the transistor 116 while a remaining terminal of the transistor 116, not connected to the memristor 113, may be connected directly to a membrane node of the post-synaptic neuron circuit B 150. For example, the pulse from the pre-synaptic neuron circuit A 130 may be a spike of the membrane node pulsed into a signal through a digital buffer.

The post-synaptic neuron circuit B 150 includes a capacitor 155, which is electrically coupled to the integrate-and-fire (I&F) neuron circuit 153 to transmit the second input signal to the synapse circuit 110.

The remaining terminal that is not connected to the transistor 116 may be connected to the voltage source $V_{ref}$ that supplies the reference voltage. The reference voltage supplied through the voltage source may be equal to or similar in magnitude to voltage drain drain (VDD)/2, or approximately one half of the power source voltage.

The post-synaptic neuron circuit B 150 may generate a spike that fires with reference to a resting voltage $V_{rest}$. For example, the resting voltage $V_{rest}$ may be approximately 0.3 (VDD).

Figure 2:
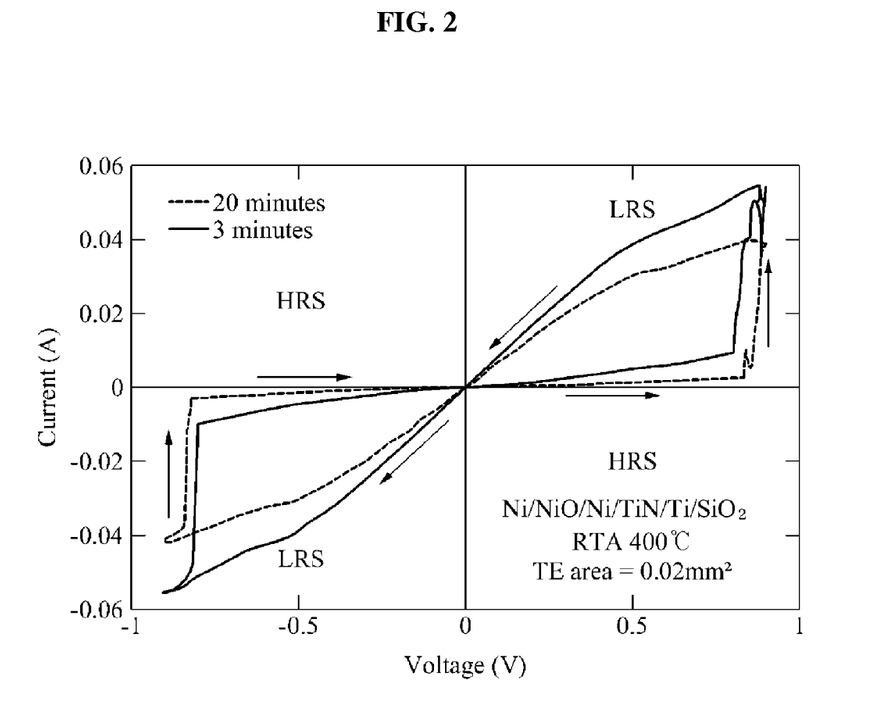
FIG. 2 is a diagram illustrating operational characteristics of an example of a memristor that is included in a synapse circuit.

FIG. 2 illustrates an example of operational characteristics of a memristor included in a synapse circuit.

According to the operational characteristics of the memristor illustrated in FIG. 2, the memristor refers to a passive device capable of remembering an amount of a current that has been passed. The memristor remembers a charge amount and a resistance of the memristor may be changed according to the charge amount. That is, the resistance of the memristor may be changed according to a flow and amount of current.

Referring to a graph of FIG. 2, it is demonstrated that almost no current flows when a voltage supplied to the memristor does not reach about ±0.8V. However, in response to the supplied voltage exceeding about ±0.8V, the amount of current flowing on the memristor suddenly increases. A voltage of a spot at which the current amount suddenly changes may be understood as a threshold voltage, which corresponds to ±0.8V in FIG. 2.

The state in which the voltage supplied to the memristor does not reach the threshold voltage and therefore almost no current flows may be referred to as the HRS. The state in which the voltage supplied to the memristor exceeds the threshold voltage and therefore the current amount is suddenly increased may be referred to as the LRS.

Figure 3:
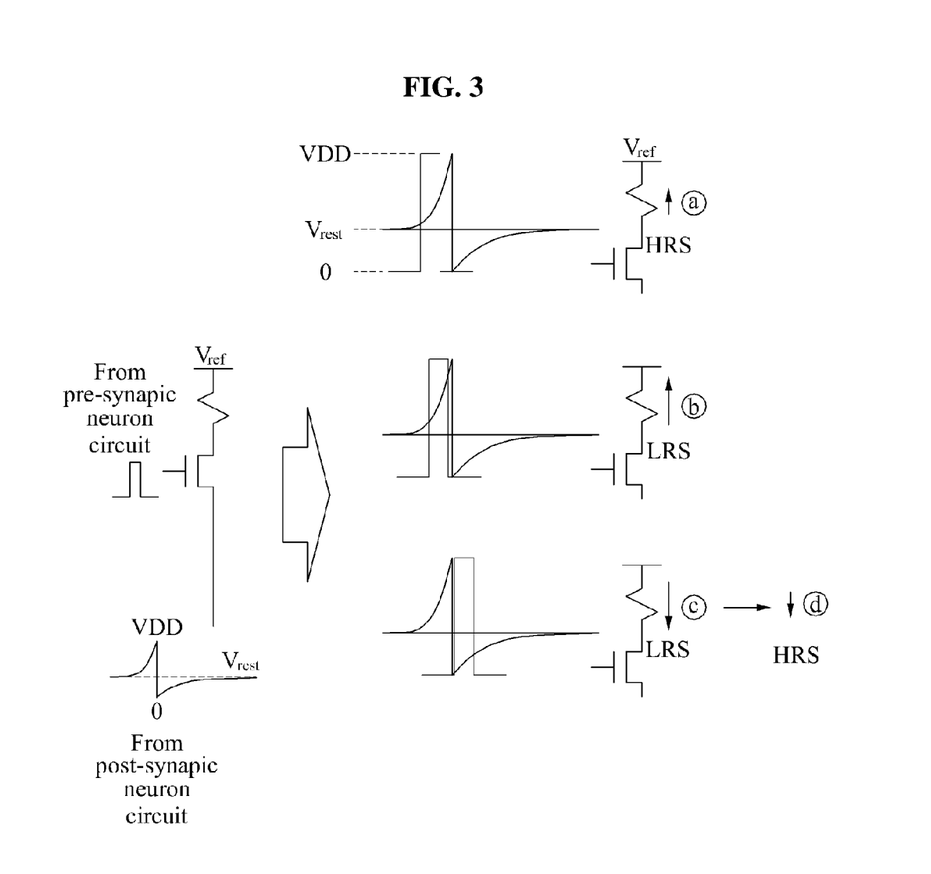
FIG. 3 is a diagram illustrating an STDP mechanism of an example of a synapse circuit.

FIG. 3 is a diagram illustrating an STDP operation mechanism of an example of a synapse circuit.

Referring to FIG. 3, the STDP operation mechanism using the synapse circuit according to one example is described.

In this example, a pre-synaptic pulse in the form of a digital pulse is generated in the pre-synaptic neuron circuit. A post-synaptic spike that is similar to an analog signal may be generated in a post-synaptic neuron circuit.

In the event that a difference in time of application with respect to the transistor between the pre-synaptic pulse and the post-synaptic spike is relatively great, a resting voltage $V_{rest}$ of the post-synaptic spike may be smaller than a reference voltage $V_{ref}$ applied to one terminal of the memristor. In this case, every time the pre-synaptic pulse is input, charges accumulate at the membrane of the post-synaptic neuron.

Next, as the time difference between the post-synaptic spike and the pre-synaptic pulse applied to the transistor is reduced, a voltage of the source terminal of the transistor connected to a post-synaptic neuron gradually increases and exceeds the reference voltage $V_{ref}$. Accordingly, a small current may flow to the memristor as shown by (a). At this time, the memristor may be in the HRS.

As the time difference between the post-synaptic spike and the pre-synaptic pulse is reduced, the memristor may be in the LRS. Therefore, a larger current than in (a) may flow as shown by (b).

Conversely, in the event that the generation time of the pre-synaptic pulse and the post-synaptic spike is almost equal or inverted, a voltage of about 0V may be supplied to the source terminal of the transistor that is connected to the post-synaptic neuron. Here, the resistance of the memristor may turn to the HRS, passed through the LRS. The current flowing on the memristor may be large as shown by (c) in case of the LRS, and may be reduced in case of the HRS. The current amount changed according to the difference in generation time of the pre-synaptic pulse and the post-synaptic spike may be always remembered by the memristor device during an STDP operation.

Thus, the STDP characteristics may be achieved using a synapse circuit according to a voltage-dependent current driven method and neuron circuits generating spikes fired with reference to a proper voltage, for example, the resting voltage $V_{rest}$. In addition, because the STDP characteristics may be achieved by only the synapse circuit without an additional circuit, a high integration neuromorphic system may be constructed.

Figure 4A:
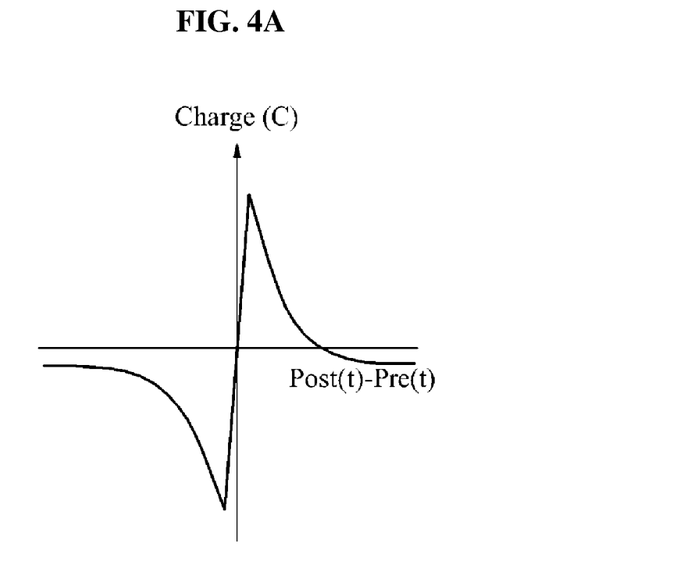
FIG. 4A is a graph illustrating a change in current according to a time difference between a spike in a post-synaptic neuron circuit and a spike in a pre-synaptic neuron circuit according to one example.
Figure 4B:
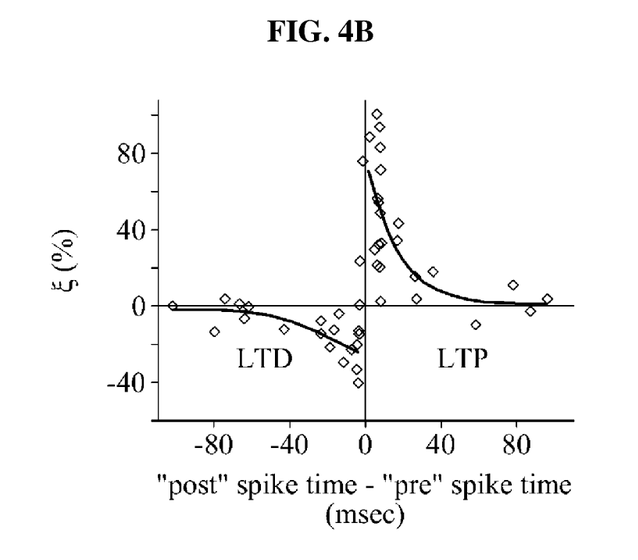
FIG. 4B is a graph illustrating relationships between a time difference in spike generation in general STDP operation based on variations of a synaptic weight.

The generation of the post-synaptic spike and the pre-synaptic pulse and the change in the amount of current flowing during the generation are described hereafter with reference to FIG. 4.

FIGS. 4A and 4B are a graph illustrating the change in the amount of current flowing between a post-synaptic neuron circuit and a pre-synaptic neuron circuit according to one example, and a graph illustrating relationships between a spike generation time difference in general STDP operation and variations of a synaptic weight.

The generation of the post-synaptic spike and the pre-synaptic pulse according to the operational mechanism illustrated in FIG. 3 and the characteristics of the current flowing during the generation are illustrated in FIG. 4A. The relationships between a pulse generation time difference in the STDP operation and the variations of the synaptic weight show characteristics very similar to a graph of FIG. 4B.

When the spike fired in the foregoing neuron circuits is modeled into an electrical waveform, the synaptic weight variations may be expressed by a subtraction between a waveform related to the pulse fired in the pre-synaptic neuron circuit (hereinafter, referred to as 'pre-synaptic pulse') and a waveform related to the spike fired in the post-synaptic neuron circuit (hereinafter, referred to as 'post-synaptic spike').

The foregoing fact may be arranged by Equation 1 and Equation 2.

$$\Delta w = \xi(tpos - tpre) \quad \text{[Equation 1]}$$

In Equation 1, $t_{pre}$ denotes the pre-synaptic pulse, $t_{pos}$ denotes the post-synaptic spike, and $\Delta w$ denotes the variation of the synaptic weight.

$$\Delta w = P(t_{pos} - t_{pre}) \quad \text{[Equation 2]}$$

In Equation 2, $P(t_{pre})$ denotes the electrical waveform related to the pre-synaptic pulse, $P(t_{pos})$ denotes the electrical waveform related to the post-synaptic spike, and $\Delta w$ denotes the variation of the synaptic weight.

Equation 1 and Equation 2 may be rearranged as shown by Equation 3.

$$\Delta w = \xi(t_{pos} - t_{pre}) = P(t_{pos}) - P(t_{pre}) \quad \text{[Equation 3]}$$

In Equation 3, the synaptic weight variation $\Delta w$ according to an N-number of the pre-synaptic pulses and an N-number of the post-synaptic spikes may be expressed by Equation 4.

$$\Delta w = \sum_{i=1}^{N} \sum_{j=1}^{N} \xi(t_i - t_j) \quad \text{[Equation 4]}$$

In Equation 4, $t_i$ denotes a firing time of the post-synaptic neuron, and $t_j$ denotes a firing time of the pre-synaptic neuron.

Figure 5:
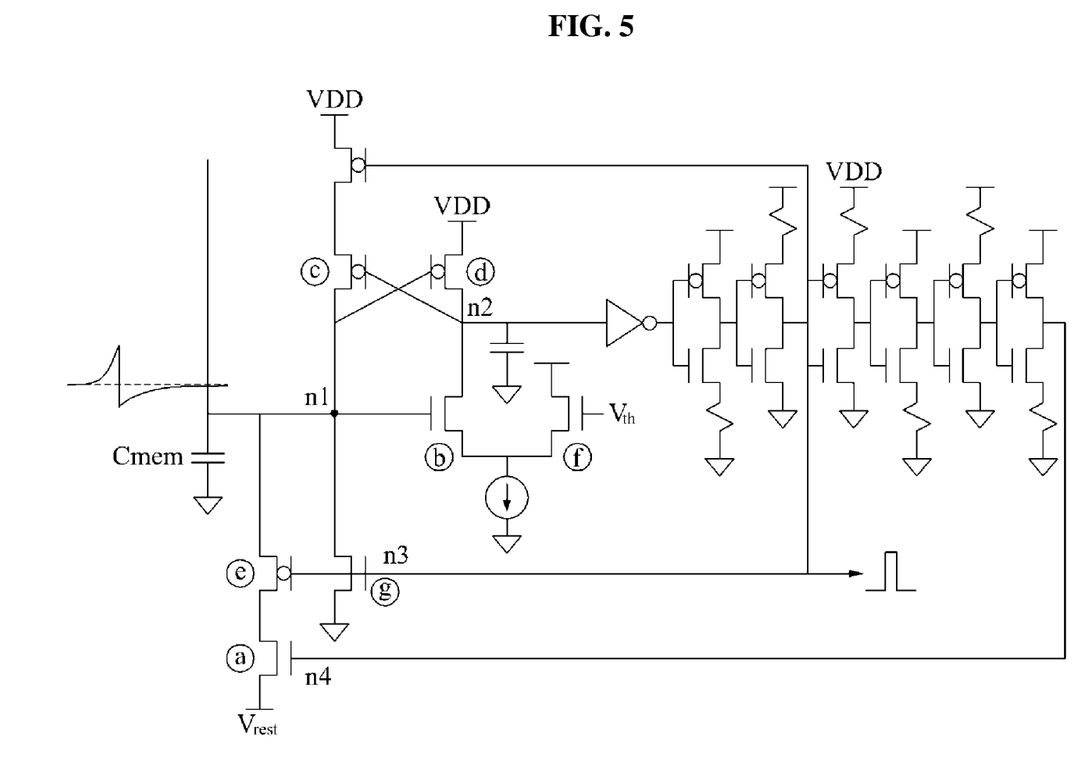
FIG. 5 is a diagram illustrating an example of a neuron circuit connected with a synapse circuit for performing an STDP operation.

FIG. 5 is a diagram illustrating an example of a neuron circuit connected with a synapse circuit for STDP operation.

FIG. 5 illustrates a post-synaptic neuron circuit that is necessary for a STDP operation. The post-synaptic neuron circuit of FIG. 5 is suggested only as an example. In other examples, other types of circuit may be applied as long as the circuit may generate a neuron waveform enabling the STDP operation.

Referring to FIG. 5, one node of a transistor (a) is connected to a desired resting voltage source, and a voltage of a node n3 is 0 V. Therefore, a transistor (e) may come into an ON state. Because a voltage source source (VSS) voltage is applied to a node n4, the transistor (a) may be in an OFF state. However, due to a leakage current flowing in the OFF state of the transistor (a), a resting voltage of a node n1, which is a membrane node, may be always maintained as $V_{rest}$.

When firing occurs, and thus the voltage of the node n1 is gradually increased, a voltage of a transistor (b) may exceed a threshold voltage. Accordingly, the transistor (b) may come into an ON state, thereby dropping the voltage of the node n2 from high to low. In addition, a transistor (c) may come into a fully ON state, thereby increasing the voltage of the node n1 up to a VDD voltage.

After a predetermined time delay from the drop of the voltage of the node n2 from high to low, a voltage of the node n3 is changed from low to high. Here, a transistor (g) may come into the ON state and the voltage of the node n1 is dropped directly to the VSS voltage. However, in the event that the voltage of the node n1 is dropped to the VSS voltage, the transistor (b) may come into the OFF state whereas the transistor (d) comes into the ON state. Therefore, the voltage of the node n2 is gradually increased. Thus, after the predetermined time delay, the voltage of the node n3 may be changed from high to low. Accordingly, the transistor (g) may come into the OFF state. Therefore, the voltage of the node n1 is gradually increased up to $V_{rest}$.

In the node n1 that is a membrane node of the post-synaptic neuron, the transistor (e) and the transistor (a) may be serially connected. Here, a source terminal of the transistor (a) may be connected to the resting voltage source that supplies the resting voltage $V_{rest}$ while a source terminal of the transistor (e) is connected to a capacitor Cmem to which the membrane voltage is charged. For example, the resting voltage $V_{rest}$ may be about 0.3 VDD.

Figure 6:
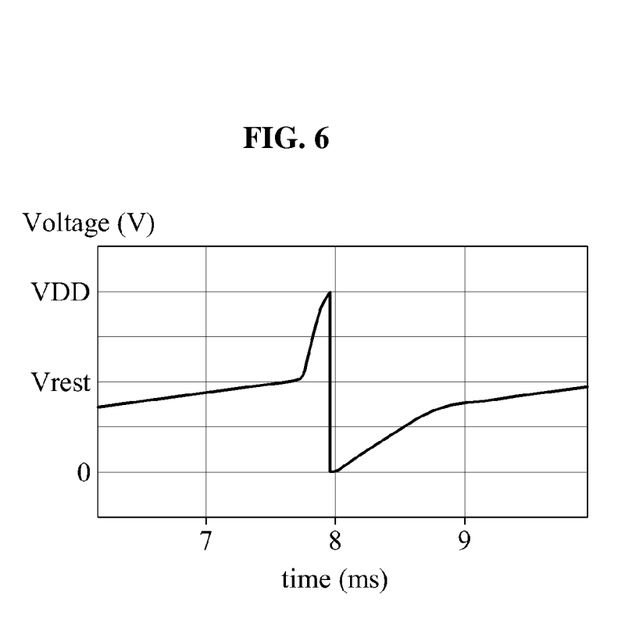
FIG. 6 is a graph illustrating a result of simulation of spike firing generated in the example of neuron circuit illustrated in FIG. 5.

FIG. 6 is a diagram illustrating a result of simulation of spike firing generated in the neuron circuit of FIG. 5. In FIG.

6, a horizontal axis denotes time (ms) and a vertical axis denote a voltage (V). In FIG. 6, VDD is approximately 1V, and $V_{rest}$ is approximately 0.5V.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A synapse circuit to perform spike timing dependent plasticity (STDP) operation, the synapse circuit comprising:
    a memristor having a resistance value; and
    a transistor connected to the memristor, the transistor configured to receive at least two input signals,
    wherein the resistance value of the memristor is changed based on a time difference between the at least two input signals received by the transistor,
    wherein terminals of the memristor are respectively coupled to a reference voltage and a drain terminal of the transistor,
    wherein the at least two input signals comprise a first input signal applied to a gate terminal of the transistor and a second input signal applied to a source terminal of the transistor, and
    wherein the first input signal is provided by a pre-synaptic neuron circuit and the second input signal is provided by a post-synaptic neuron circuit.

2. The synapse circuit of claim 1, wherein the resistance value of the memristor is changed based on a voltage change caused by the time difference between the at least two input signals.

3. The synapse circuit of claim 1, wherein the resistance value of the memristor is changed based on a time difference between a first input signal applied to a gate terminal of the transistor and a second input signal based on a membrane voltage applied to a source terminal of the transistor.

4. The synapse circuit of claim 3, wherein a direction of a current flowing on the memristor is determined by a voltage difference caused by the time difference between the first input signal and the second input signal.

5. The synapse circuit of claim 3, wherein an amount of a current flowing on the memristor is determined by a voltage difference caused by the time difference between the first input signal and the second input signal.

6. The synapse circuit of claim 3, wherein the synapse circuit further comprises:
    a first terminal connected to the gate terminal of the transistor and configured to provide the first input signal, and a second terminal connected to the source terminal of the transistor and configured to provide the second input signal, and
    the synapse circuit is connected to the pre-synaptic neuron circuit through the first terminal and to the post-synaptic neuron circuit through the second terminal.

7. The synapse circuit of claim 6, wherein the post-synaptic neuron circuit is configured to generate a spike fired with reference to a resting voltage.

8. The synapse circuit of claim 7, wherein the post-synaptic neuron circuit comprises an N-metal oxide semiconductor (MOS) and a P-MOS transistor, the N-MOS transistor and the P-MOS transistor being serially connected;
    a resting voltage source to supply the resting voltage is connected to a source terminal of the N-MOS transistor; and
    a capacitor is connected to a source terminal of the P-MOS transistor.

9. The synapse circuit of claim 1, wherein different voltages are applied to the memristor and the source terminal of the transistor.

10. The synapse circuit of claim 1, wherein a channel of the memristor is serially connected to a channel of the transistor.

11. The synapse circuit of claim 1, wherein the transistor comprises an N-MOS transistor.

12. A neuromorphic system comprising:
    a synapse circuit configured to perform spike timing dependent plasticity (STDP) operation, the synapse circuit comprising a first terminal, a second terminal, a memristor having a resistance value, and a transistor connected to the memristor;
    a pre-synaptic neuron circuit connected to the memristor through the first terminal of the synapse circuit; and
    a post-synaptic neuron circuit connected to the memristor through the second terminal of the synapse circuit,
    wherein the resistance value of the memristor is changed based on a time difference between at least two input signals received by the synapse circuit,
    wherein terminals of the memristor are respectively coupled to a reference voltage and a drain terminal of the transistor,
    wherein the at least two input signals comprise a first input signal applied to a gate terminal of the transistor and a second input signal applied to a source terminal of the transistor, and
    wherein the first input signal is provided by a pre-synaptic neuron circuit and the second input signal is provided by a post-synaptic neuron circuit.

13. The neuromorphic system of claim 12, wherein the first terminal of the synapse circuit is connected to a gate terminal of the transistor to provide a first input signal, and the second terminal of the synapse circuit is connected to a source terminal of the transistor to provide a second input signal.

14. The neuromorphic system of claim 13, wherein the resistance value of the memristor is changed based on a time difference between the first input signal applied to the gate terminal of the transistor and the second input signal based on a membrane voltage applied to the source terminal of the transistor.

15. The neuromorphic system of claim 14, wherein a direction of a current flowing on the memristor is determined by a voltage difference caused by the time difference between the first input signal and the second input signal.

16. The neuromorphic system of claim 14, wherein an amount of a current flowing on the memristor is determined by a voltage difference caused by the time difference between the first input signal and the second input signal.

17. The neuromorphic system of claim 13, wherein the post-synaptic neuron circuit is configured to generate a spike fired with reference to a resting voltage.

18. The neuromorphic system of claim 17, wherein the post-synaptic neuron circuit comprises an N-metal oxide semiconductor (MOS) and a P-MOS transistor, wherein the N-MOS transistor and the P-MOS transistor are serially connected, a resting voltage source to supply the resting voltage is connected to a source terminal of the N-MOS transistor, and a capacitor is connected to a source terminal of the P-MOS transistor.

19. A method of performing spike timing dependent plasticity (STDP) operation between a pre-synaptic neuron circuit and a post-synaptic neuron circuit, the method comprising:

receiving a pre-synaptic input signal from the pre-synaptic neuron circuit, the pre-synaptic input signal comprising a first input signal applied to a gate terminal of a transistor;

receiving a post-synaptic input signal from the post-synaptic neuron circuit, the post-synaptic input signal comprising a second input signal applied to a source terminal of the transistor; and adjusting a resistance value of a memristor based on a time difference between the pre-synaptic input signal and the post-synaptic input signal, wherein the post-synaptic input signal is based on a charge stored in a capacitor of the post synaptic neuron circuit.

* * * * *